(12) United States Patent
Haussmann et al.

(10) Patent No.: US 8,088,664 B2
(45) Date of Patent: Jan. 3, 2012

(54) METHOD OF MANUFACTURING INTEGRATED DEEP AND SHALLOW TRENCH ISOLATION STRUCTURES

(75) Inventors: Joerg Haussmann, Freising (DE); Christoph Dirnecker, Eching/Viecht (DE); Rupert Wagner, Karlsfeld (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 11/873,062

(22) Filed: Oct. 16, 2007

(65) Prior Publication Data
US 2008/0248627 A1 Oct. 9, 2008

(30) Foreign Application Priority Data
Oct. 17, 2006 (DE) .................. 10 2006 048 960

(51) Int. Cl.
*H01L 21/336* (2006.01)
*H01L 21/302* (2006.01)
*H01L 21/461* (2006.01)

(52) U.S. Cl. ........ 438/296; 438/294; 438/734; 438/735; 438/736; 438/737

(58) Field of Classification Search .................. None
See application file for complete search history.

(56) References Cited

U.S. PATENT DOCUMENTS

| | | | |
|---|---|---|---|
| 6,309,962 B1 * | 10/2001 | Chen et al. | 438/638 |
| 6,667,226 B2 | 12/2003 | Pinto et al. | |
| 6,673,635 B1 | 1/2004 | Hellig et al. | |
| 6,864,152 B1 | 3/2005 | Mirbedini et al. | |
| 2002/0072197 A1 | 6/2002 | Kang et al. | |
| 2002/0109140 A1 * | 8/2002 | Norstrom et al. | 257/57 |
| 2002/0155698 A1 * | 10/2002 | Iyer et al. | 438/636 |
| 2003/0020117 A1 * | 1/2003 | Lee et al. | 257/347 |
| 2006/0046407 A1 | 3/2006 | Juengling | |
| 2006/0134882 A1 | 6/2006 | Zhang | |
| 2006/0175660 A1 * | 8/2006 | Cheng et al. | 257/347 |

* cited by examiner

*Primary Examiner* — N Drew Richards
*Assistant Examiner* — Michael Jung
(74) *Attorney, Agent, or Firm* — Warren L. Franz; Wade J. Brady, III; Frederick J. Telecky, Jr.

(57) ABSTRACT

A method of forming an integrated deep and shallow trench isolation structure comprises depositing a hard mask on a film stack having a plurality of layers formed on a substrate such that the hard mask is deposited on a furthermost layer from the substrate, imprinting a first pattern into the hard mask to define an open end of a first trench, imprinting a second pattern into the hard mask to define an open end of a second trench, and etching into the film stack the first trench to a first depth and the second trench to a second depth such that the first trench and the second trench each define a blind aperture in the surface of the film stack.

6 Claims, 13 Drawing Sheets

METHOD OF MANUFACTURING INTEGRATED DEEP AND SHALLOW TRENCH ISOLATION STRUCTURES

FIELD OF THE INVENTION

The present invention relates to a method of manufacturing integrated deep and shallow trench isolation structures. More particularly, the present invention relates to a method of manufacturing simultaneously filled integrated deep and shallow trench isolation structures using an imprinted hard mask.

BACKGROUND OF THE INVENTION

When several semiconductor devices are provided on a chip, it is required to isolate them from each other in order to suppress parasitic capacitances. Shallow trench isolation is known, whereby trenches are etched into the surface of the semiconductor layer structure in which the devices are formed. However, for high performance bipolar applications, shallow trench isolation is not sufficient to suppress parasitic capacitances. To improve the isolation characteristics, the integration of deep trenches in addition to shallow trench isolation is required in structures formed on silicon on insulator substrates. This is especially beneficial, but not limited to cases where the structures are formed on silicon on insulator substrates. The same applies where the structures are formed from bulk silicon.

Integrated sequences for combined deep and shallow trench isolation have been disclosed in which the deep trench is formed first and then filled with a resist plug, upon which shallow trenches are subsequently patterned. However, the known methods of forming integrated deep and shallow trench isolation structures are not suitable for very deep trenches. This is because either the number of deep trenches per unit area or the depth of the deep trenches needs to be limited, in order to avoid insufficient filling with resist before the shallow trench pattern is formed.

SUMMARY OF THE INVENTION

The present invention has been devised with the foregoing in mind. The present invention provides a method of forming an integrated deep and shallow trench isolation structure, comprising depositing a hard mask on a multilayer structure (designated herein as a film stack) having a plurality of layers grown on a substrate such that the hard mask is formed on an uppermost layer relative to the substrate, imprinting a first pattern into the hard mask to define an open end of a first trench and imprinting a second pattern into the hard mask to define an open end of a second trench, and etching into the film stack the first trench to a first depth and the second trench to a second depth.

Preferably, the film stack is formed by growing a silicon oxide layer on a substrate and depositing a silicon nitride layer on silicon-on-insulator (SOI) or bulk silicon substrate wafers. Ideally, a blind end of the first trench should be provided in the buried oxide layer and a blind end of the second trench should be provided in the silicon layer, in the case where a silicon-on-insulator substrate is used. In this case, the first trench is then a deep trench and the second trench is a shallow trench. In the case where bulk silicon substrate applications are employed, the open end of the second trench is much deeper relative to the open end of the first trench. Before the trenches are formed, the hard mask can be deposited on the nitride layer, which is the top layer in the film stack. In this method, the deep trench can be formed before the shallow trench or the shallow trench can be formed first.

Alternatively, the hard mask can also comprise a first portion and a second portion. The first pattern can then be created on the first portion of the hard mask to define the open end of the first trench and then the second pattern can be created on the second portion of the hard mask to define an open end of the second trench.

The first trench and the second trench can be lined with a third oxide layer. The first trench and the second trench can then be filled with an insulating material, for example silicon oxide or undoped polysilicon. This method eliminates the need for extra resist filling to enable shallow trench patterning. It also avoids insufficient filling with resist. Furthermore, this method only requires a single sequence to simultaneously fill and planarize the deep and shallow trenches. The nitride layer can be removed after a final planarization step.

When imprinting the patterns for the trench openings in the hard mask, the second pattern can either be imprinted relative to the first pattern such that the open end of the second trench is isolated from the open end of the first trench; or such that the open end of the second trench is coincident with the open end of the first trench; or such that the open end of the second trench bounds the open end of the first trench. Therefore, this method allows full flexibility in the layout of the trenches. Deep and shallow trenches can either be integrated such that the deep trenches are isolated, semi-isolated or shallow trench bounded within the same device layouts. The method also allows design of pure shallow trench areas and areas with a high density of deep trenches (deep trench arrays).

The present invention also provides an integrated deep and shallow trench isolation structure comprising a film stack having a plurality of layers, a first trench defining a blind aperture in the surface of the film stack and having a first depth, and a second trench defining a blind aperture in the surface of the film stack and having a second depth.

DESCRIPTION OF THE VIEWS OF THE DRAWING

Further advantages and characteristics of the invention ensue from the description below of the preferred embodiments and from the accompanying drawings, in which.

DETAILED DESCRIPTION

Figure 1:
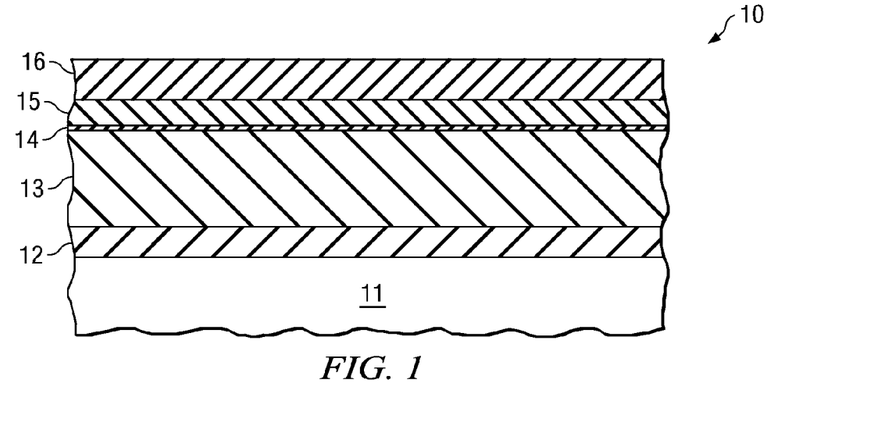
FIG. 1 is a schematic side view of a cross-section of a film stack according to first and second embodiments of the invention.

In FIG. 1 a film stack 10 is provided on a substrate 11 and comprises a first buried oxide layer 12 underneath a silicon layer 13. An initial oxide layer 14 is provided on the silicon layer 13 and a nitride layer 15 is provided on the initial oxide layer 14. A hard mask 16 is deposited on the top surface of film stack 10. The same film stack 10 shown in FIG. 1 is used for the first and second embodiments of the invention.

Figure 2:
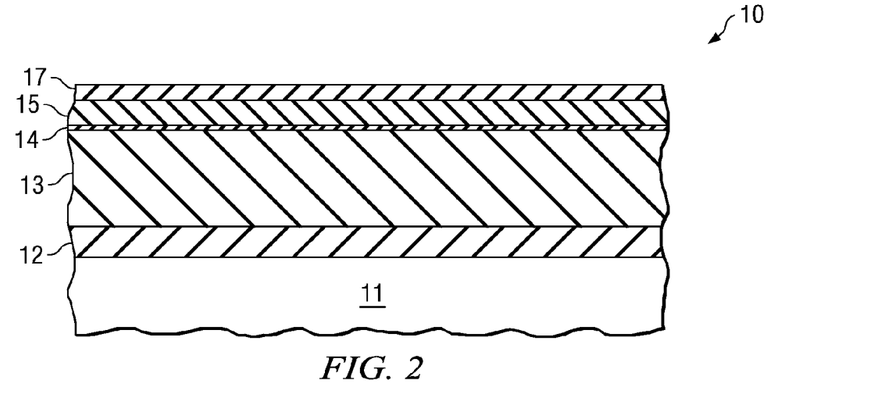
FIG. 2 is a schematic side view of a cross-section of a film stack according to a third embodiment of the invention.

FIG. 2 shows a film stack 10 used for a third embodiment of the invention. The structure of the substrate 11 buried oxide layer 12, silicon layer 13, initial oxide layer 14 and initial nitride layer 15 of the film stack 10 is the same as that used in the first embodiment. However, instead of the hard mask 16, the third embodiment has a first hard mask 17 deposited on the surface of the nitride layer 15.

FIGS. 1, 3, 6, 9, 13, 16, 19, 21, 23, 25, 27, 29, 31, 33 and 35 relate to the first described embodiment; FIGS. 1, 4, 7, 10, 14, 17, 19, 21, 23, 25, 27, 29, 31, 33 and 35 relate to the second described embodiment; and FIGS. 2, 5, 8, 11, 12, 15, 18, 20, 22, 24, 26, 28, 30, 32, 34 and 36 relate to the third described embodiment. In all embodiments, the growth of the thin initial oxide layer 14 acts as stress relief for the subsequent deposition of the initial nitride layer 15. The function of the buried oxide layer 12 under the silicon layer 13 is to isolate the device from the substrate 11. The thickness of the silicon layer 13 can vary from 1 micrometer to more than 8 micrometers depending on the application. The thickness of the buried oxide layer 12 is typically in the range between 0.1 micrometers and 0.5 micrometers. In the case where a silicon-on-insulator substrate is used, the depth of the deep trenches is limited by the buried oxide layer 12. When bulk silicon is used, the depth of the trenches can vary depending on application requirements. The thickness of the hard mask layers 16 and 17 depends on the required depth of the trenches that are to be etched into the film stack 10. The hard mask 16 used in the first and second embodiments is relatively thicker than the first hard mask 17 used in the third embodiment. All mask layers should preferably be formed from an oxide.

Figure 3:
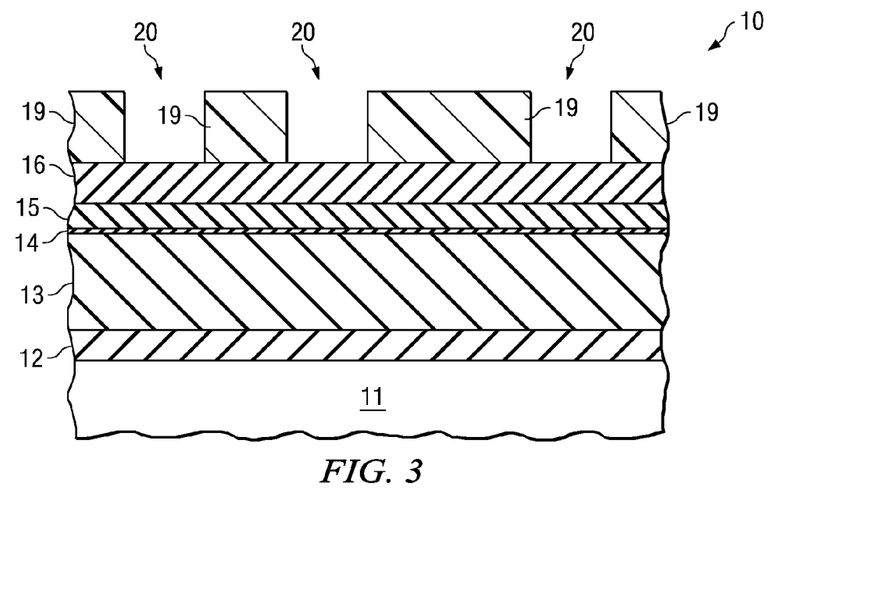
FIG. 3 is a schematic side view of a cross-section of a first stage of formation of the film stack according to a first embodiment of the invention.
Figure 4:
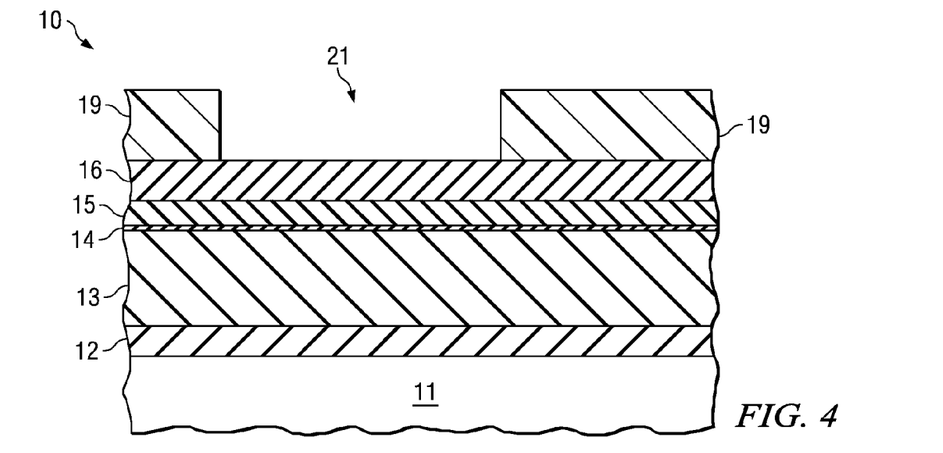
FIG. 4 is a schematic side view of a cross-section of a first stage of formation according to a second embodiment of the invention.
Figure 5:
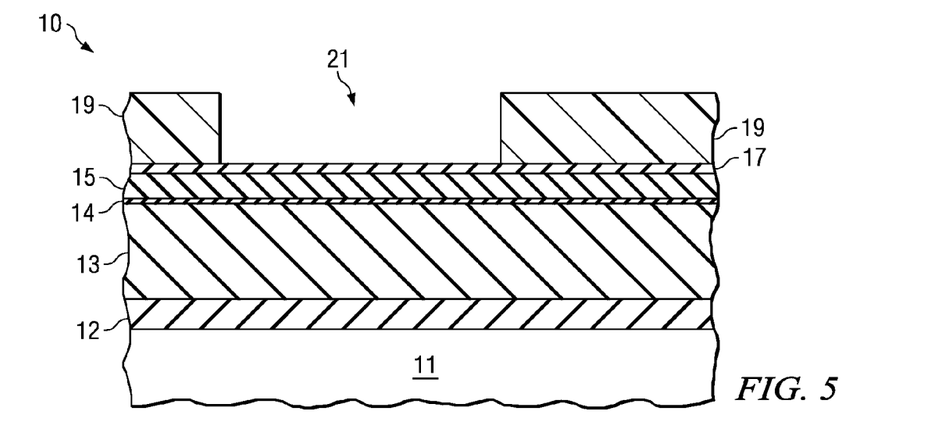
FIG. 5 is a schematic side view of a cross-section of a first stage of formation according to a third embodiment of the invention.
Figure 6:
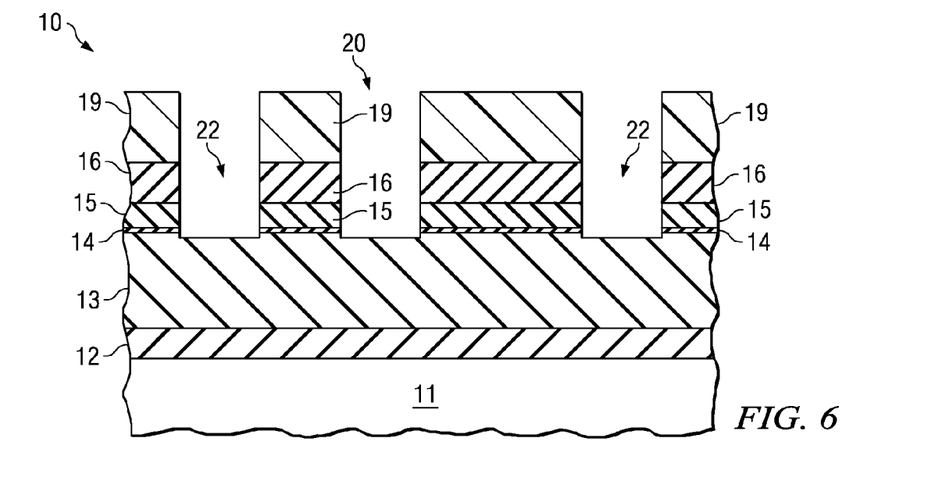
FIG. 6 is a further stage of formation according to a first embodiment of the invention.

In FIGS. 3, 4 and 5, the first stage of formation is shown for the first, second and third embodiments, respectively. A first pattern is created in a resist 19. The pattern in the resist 19 defines the first trench openings 20 and 21. In the first embodiment the openings 20 are for deep trenches so that the deep trench openings are formed first. In the second and third embodiments shallow trench openings 21 are formed first. Deep trenches can either be designed to be isolated (not guarded by a shallow trench), semi-isolated (asymmetrically guarded by a shallow trench only on one side) or shallow trench bounded (guarded by a shallow trench on both sides). Any combinations of these layout types are allowed within the same device. FIG. 6 shows a second etching stage according to the first embodiment. The pattern in the resist 19, which defines the openings 20 of the deep trenches is transferred into the underlying film stack 10 by means of plasma etching. In the first embodiment, the complete film stack consisting of an initial oxide 14, initial nitride 15 and hard mask 16 is removed selectively from the top silicon layer 13 to form deep trench openings 20. The deep trenches 22 are formed in the film stack 10 as blind apertures such that the blind end of each deep trench 22 is located in one of the layers of the film stack 10 and the open end of a trench is located, in the initial stages of etching, in the resist 19 provided on the hard mask layer 16. At this stage of etching, the blind ends of the deep trenches 22 are formed in the silicon layer 13 in the first embodiment.

Figure 7:
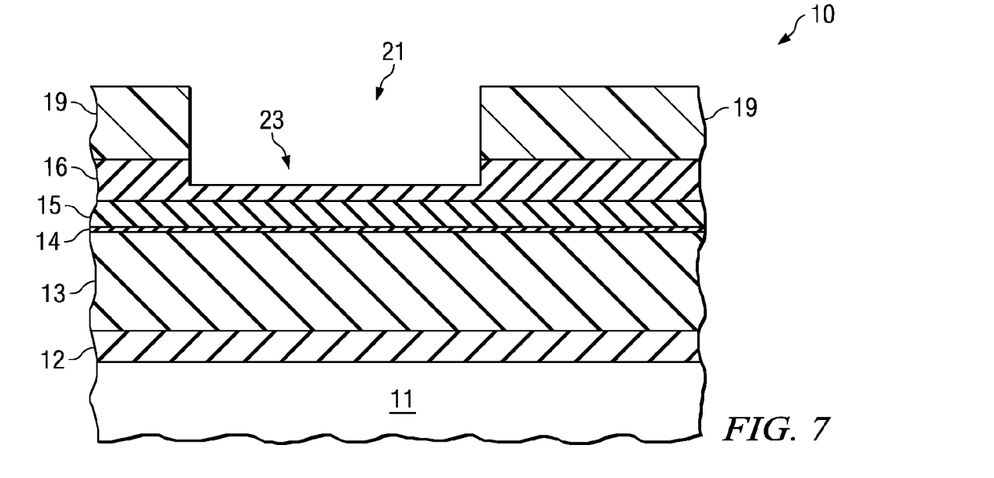
FIG. 7 is a further stage of formation according to a second embodiment of the invention.

In a second etching stage according to the second embodiment, as shown in FIG. 7, only a partial shallow trench 23 is etched. The shallow trench 23 is etched partially into the hard mask layer 16 such that the blind end of the shallow trench 23 is located in the hard mask layer 16 at this stage and the open end of the shallow trench 23 is located in the resist 19 provided on the hard mask layer 16. The hard mask loss in the structure of the second embodiment is designed such that later etching of deep trenches will safely remove the remaining hard mask film in the shallow trench region with limited loss of the initial nitride layer 15 below.

Figure 8:
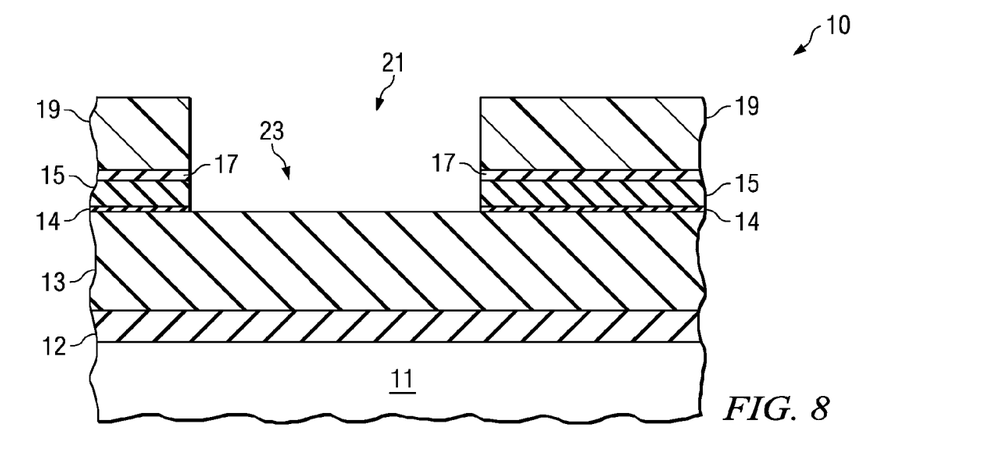
FIG. 8 is a further stage of formation according to a third embodiment of the invention.

In a second stage of etching according to the third embodiment shown in FIG. 8, the complete film stack consisting of an initial oxide 14, initial nitride 15 and hard mask 16 is removed selectively from the top silicon layer 13 to form a shallow trench 23. At this stage of etching, the blind end of the shallow trench 23 is located in the silicon layer 13 and the open end of the shallow trench 23 is located in the resist 19 provided on the hard mask layer 16.

Figure 9:
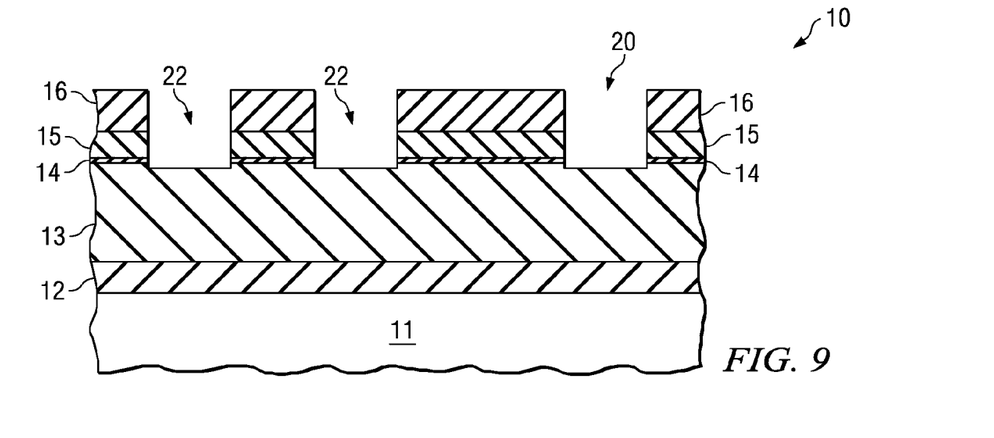
FIG. 9 is a further stage of formation according to a first embodiment of the invention.
Figure 10:
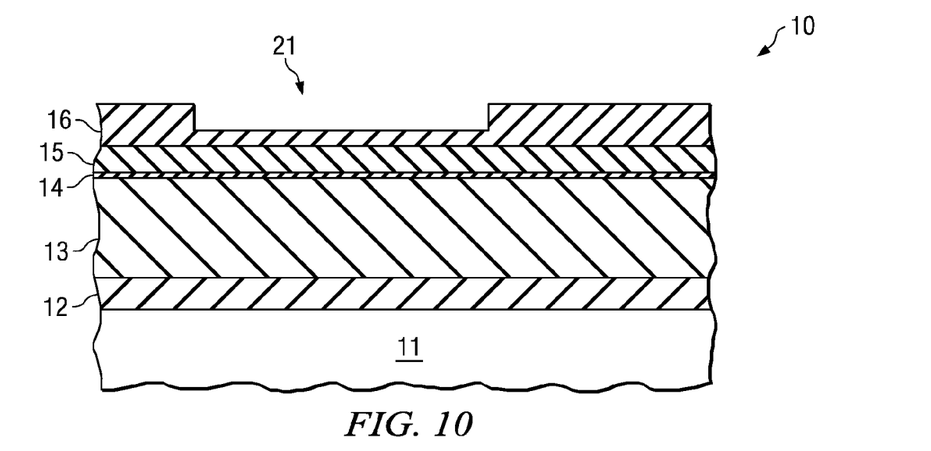
FIG. 10 is a further stage of formation according to a second embodiment of the invention.
Figure 11:
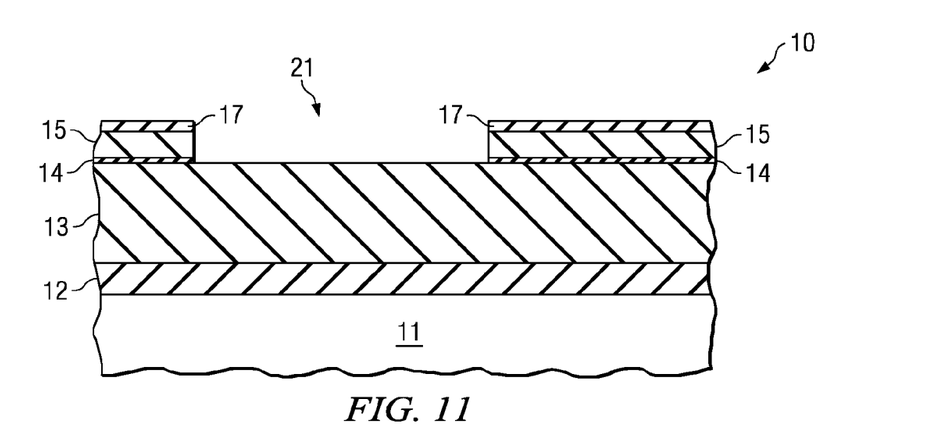
FIG. 11 is a further stage of formation according to a third embodiment of the invention.

In FIGS. 9, 10 and 11, a further stage of etching is shown according to the first, second and third embodiments, respectively. The remaining photoresist 19 from the initial imprinted pattern of the trench openings is removed using conventional ash and wet clean techniques in all three embodiments.

Figure 12:
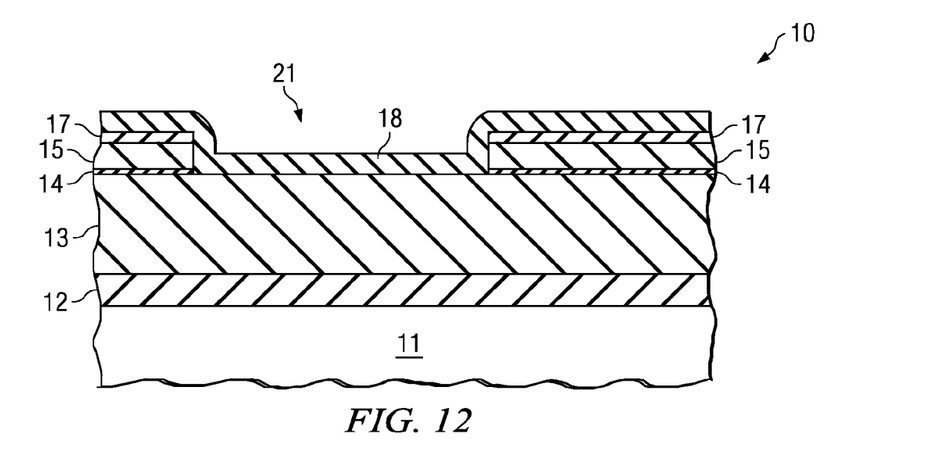
FIG. 12 is a further stage of formation according to a third embodiment of the invention.

FIG. 12 shows the insertion of a second hard mask 18, which is only employed in the third embodiment. The second hard mask 18 is deposited on the surface of the first hard mask 17 and also lines the trench over the initial nitride layer 15, the initial oxide layer 14 and the silicon layer 13. The first hard mask 17 and the second hard mask 18 adopt approximately the same total thickness as the hard mask 16 used on the first and second embodiments. The thickness of the additional hard mask 18 depends on the amount of consumption of the hard mask during deep trench formation. The first hard mask 17 and the second hard mask 18 are preferably made of the same material but they may also be made from different materials.

Figure 13:
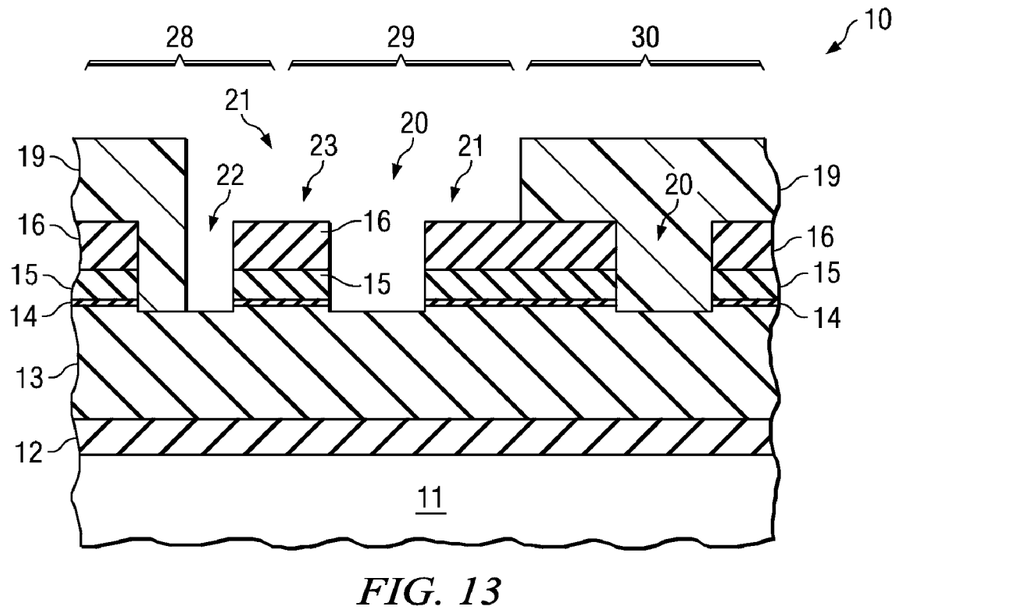
FIG. 13 is a further stage of formation according to a first embodiment of the invention.
Figure 14:
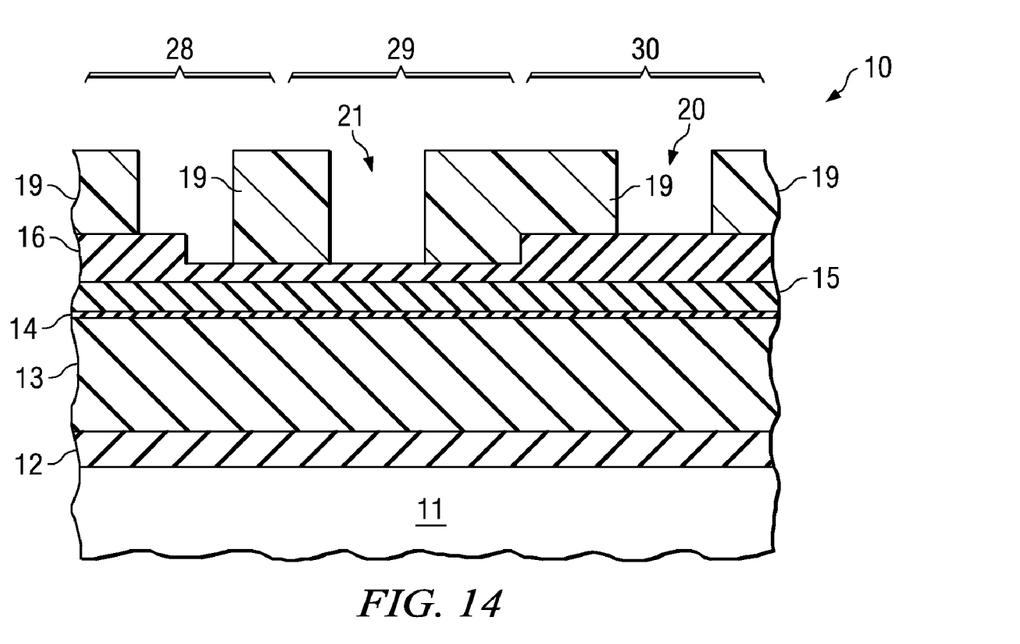
FIG. 14 is a further stage of formation according to a second embodiment of the invention.
Figure 15:
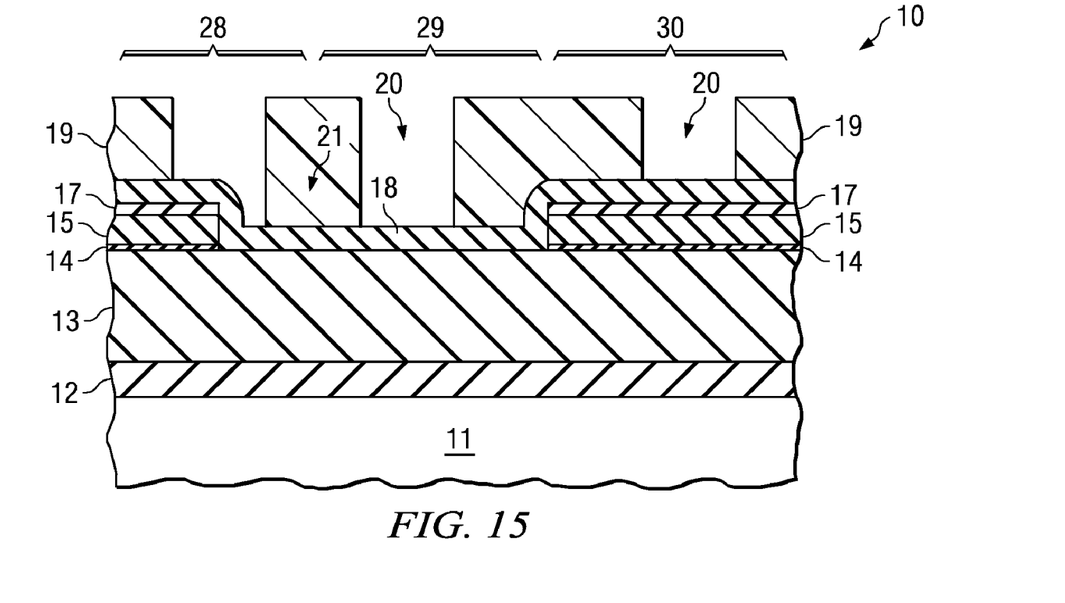
FIG. 15 is a further stage of formation according to a third embodiment of the invention.

In FIGS. 13, 14 and 15, which show a further stage of formation according to the first, second and third embodiments, respectively, a second resist pattern is created in the resist. The second resist pattern defines openings for the other type of trenches (shallow trench openings 21 in the first embodiment and deep trench openings 20 in the second and third embodiments). For shallow trench bounded deep trenches 29, the shallow trench opening 21 overlaps the deep trench opening 20 on both sides. For isolated deep trenches 30, a minimum spacing to the next shallow trench opening is maintained and the shallow trench opening 21 does not overlap the isolated deep trench opening 20. For semi-isolated deep trenches 28, the shallow trench opening 21 overlaps the deep trench opening 20 on one side while not overlapping the deep trench opening 20 on the other side. All three configurations—shallow trench bounded deep trenches 29, isolated deep trenches 30 and semi-isolated deep trenches 28 are provided in a single structure in all three embodiments.

Figure 16:
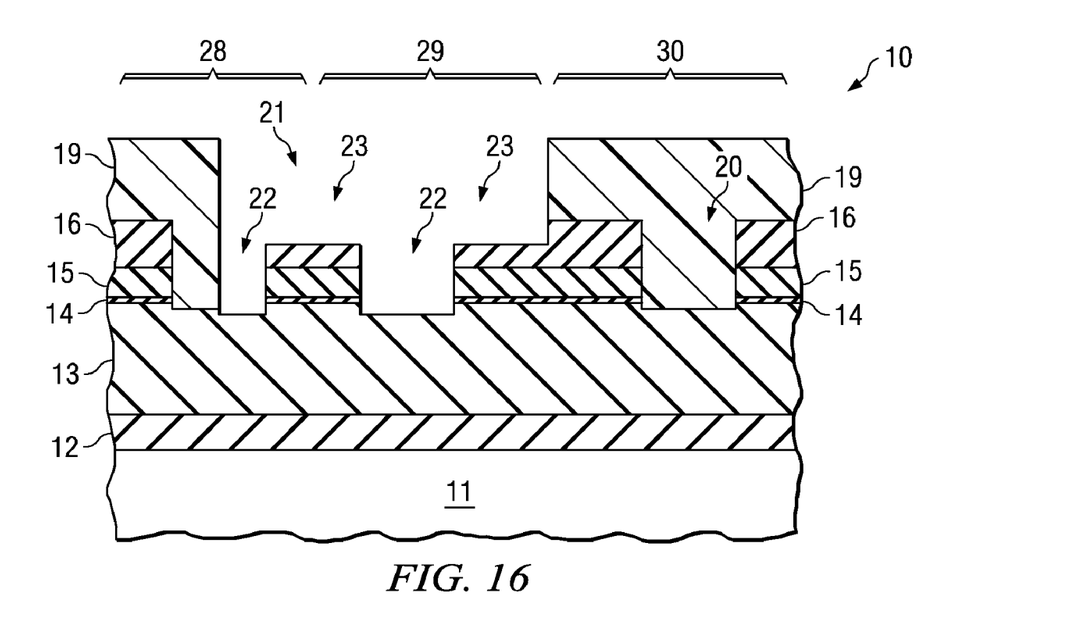
FIG. 16 is a further stage of formation according to a first embodiment of the invention.
Figure 17:
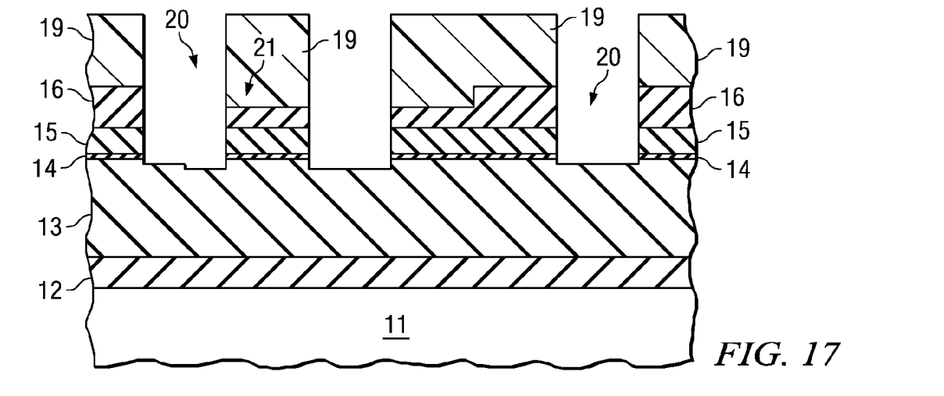
FIG. 17 is a further stage of formation according to a second embodiment of the invention.
Figure 18:
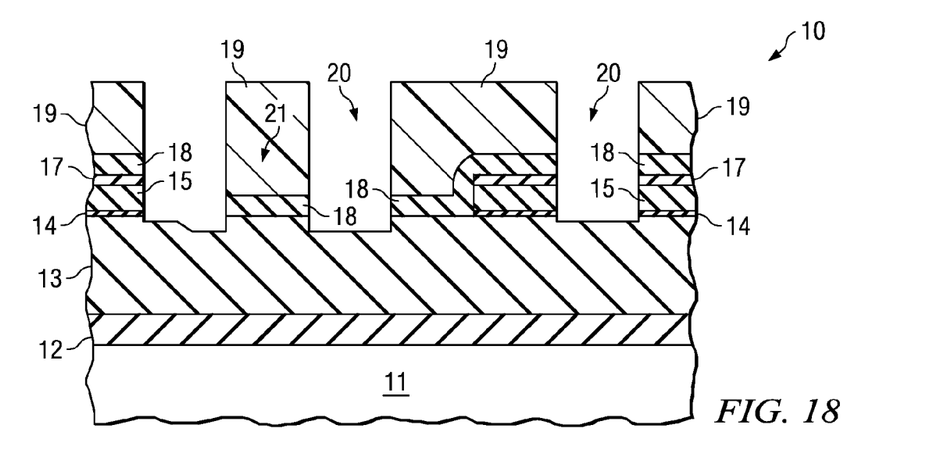
FIG. 18 is a further stage of formation according to a third embodiment of the invention.

In FIGS. 16 to 18 the second resist pattern is now transferred into the upper film stack 10 by means of plasma etching for all three embodiments. In the first embodiment, the hard mask 16 is partially etched to a certain extent with high selectivity to the exposed silicon layer 13 in the existing deep trench openings 20. In the second embodiment and the third embodiment the remaining film stack is completely etched through with high selectivity to silicon in the silicon layer 13. High selectivity to silicon is desirable but not necessarily required.

Figure 19:
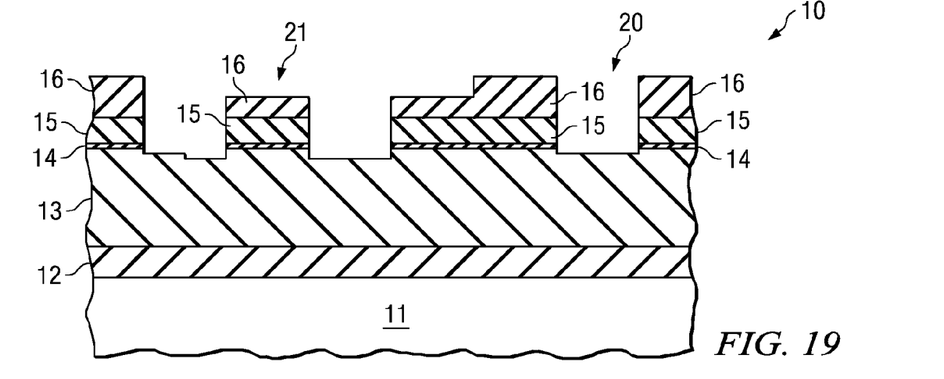
FIG. 19 is a further stage of formation according to first and second embodiments of the invention.
Figure 20:
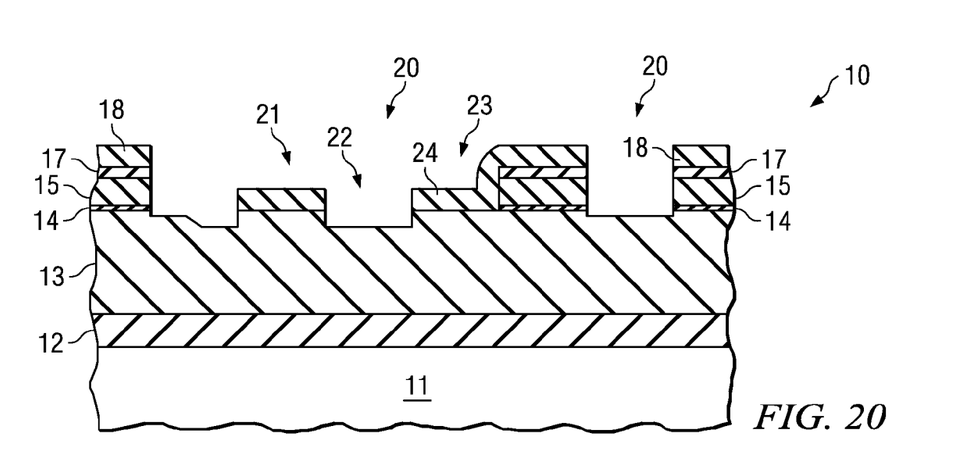
FIG. 20 is a further stage of formation according to a third embodiment of the invention.
Figure 21:
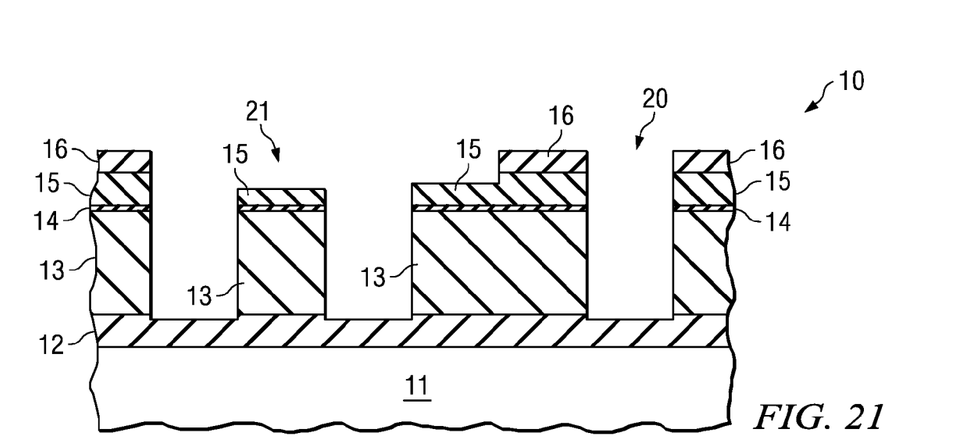
FIG. 21 is a further stage of formation according to first and second embodiments of the invention.
Figure 22:
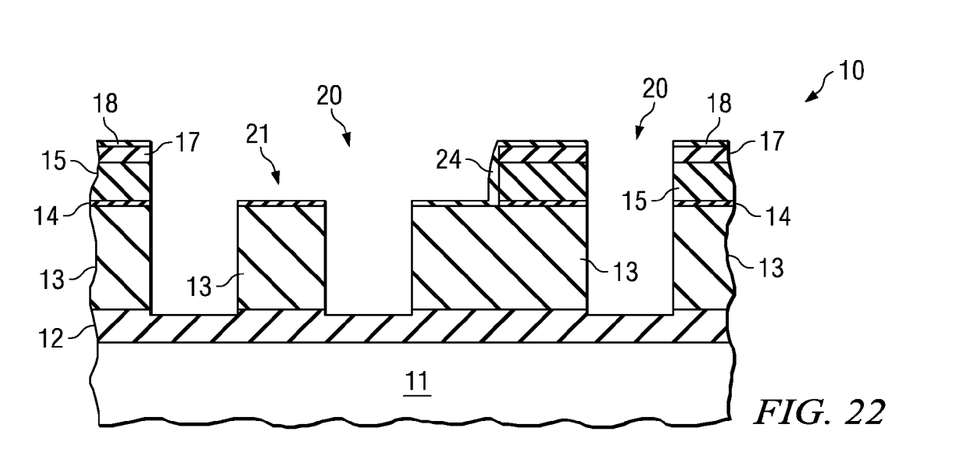
FIG. 22 is a further stage of formation according to a third embodiment of the invention.

In FIGS. 19 and 20, the structure for the first (FIG. 19), second (FIG. 19) and third (FIG. 20) embodiments is shown after the second resist pattern has been removed by conventional ash and wet clean techniques. In the second and third embodiments it is possible to keep the resist pattern during the subsequent deep trench etch step.

Deep trenches 22 are etched into the silicon layer 13 with high selectivity to the hard masks 16, 17 and 18. This takes place for all three embodiments, the first and second embodiments being shown in FIG. 21 and the third embodiment being shown in FIG. 22. In the case where a silicon-on-insulator substrate is used for the substrate 11, the buried oxide layer 12 acts as a stopping layer and defines the depth of the deep trenches 23 such that the blind ends of the deep trenches are now located in the buried oxide layer 12. Ideally, the initial nitride layer 15 can be used as an etch stop in the shallow trench regions such that the hard mask film 16 or 17 and 18 is safely removed completely while still leaving enough of the initial nitride 15 to safely stop in the trenches (as shown in FIG. 19 for the first and second embodiments).

The process can also be designed to stop within the hard mask film instead, if required. Because the initial nitride has already been removed in shallow trench areas in the third embodiment, the deep trench etch has to stop within the hard mask in this case. Resist 19 can still be present during the deep trench etch process. The remaining resist 19 can be removed by ashing at an intermediate state of etching before exposing the hard mask or it can be fully consumed by the etching process itself. This can occur in the second and third embodiments without limiting the flexibility of the trench layout. In the first embodiment the deep trench etching operation allows the presence of the resist 19 only if isolated and semi-isolated deep trenches are not included in the layout. In the third embodiment shown in FIG. 22, the formation of a spacer 24 at the edge of a shallow trench 23 starts to take place when etching the deep trenches 22. This particular spacer 24 will remain part of the isolation structure until the completion of the isolation process sequence.

Figure 23:
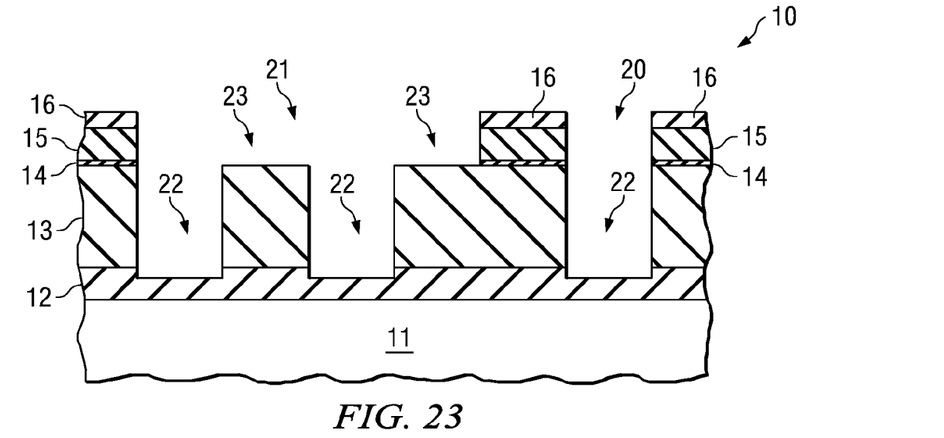
FIG. 23 is a further stage of formation according to first and second embodiments of the invention.
Figure 24:
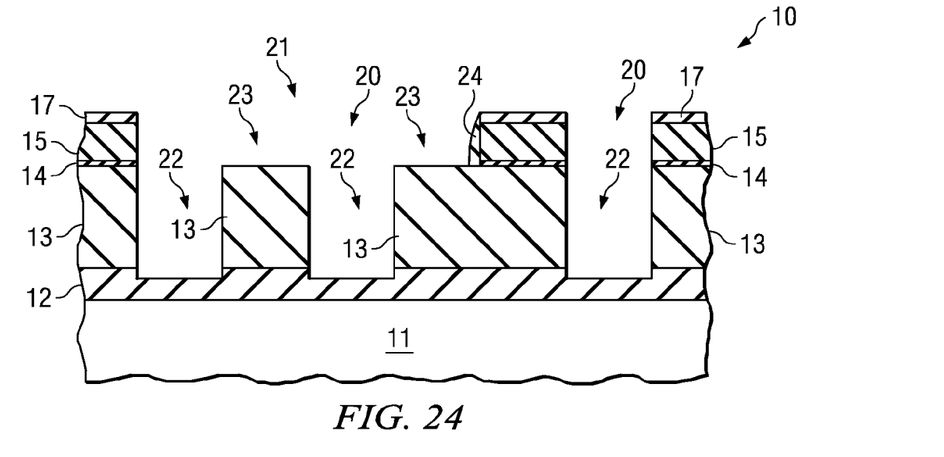
FIG. 24 is a further stage of formation according to a third embodiment of the invention.

Once the deep trenches 22 are etched to the target depth such that the blind end of each deep trench 22 is provided in the buried oxide layer 12 and all photoresist has been removed from shallow trench areas 23, another etch process with inverse selectivity requirement is applied to remove the remaining upper film stack layers (nitride 15 and initial oxide 14) from the shallow trench regions 23, while not significantly removing any of the silicon layer 13. The thicker hard mask provided on top of the active device areas prevents unwanted loss of the nitride layer 15 and remains thick enough to withstand the subsequent shallow trench etch operation. This is shown in FIG. 23 for the first and second embodiments, and in FIG. 24 for the third embodiment.

Figure 25:
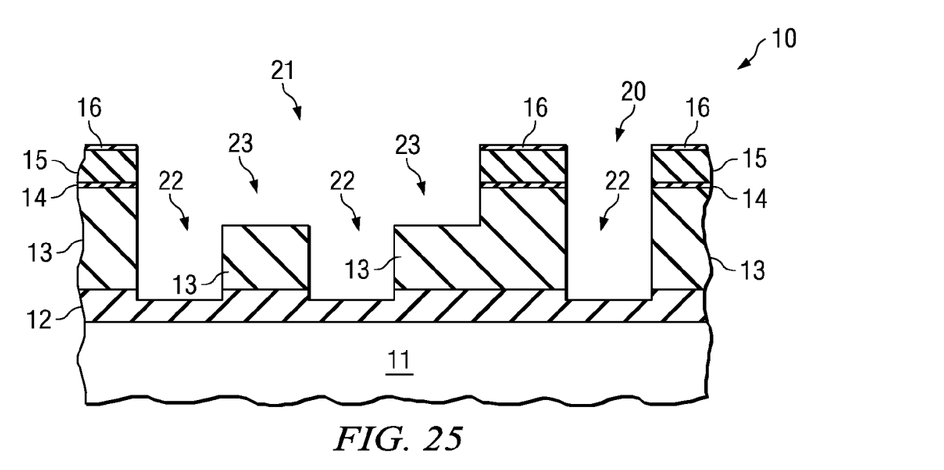
FIG. 25 is a further stage of formation according to first and second embodiments of the invention.
Figure 26:
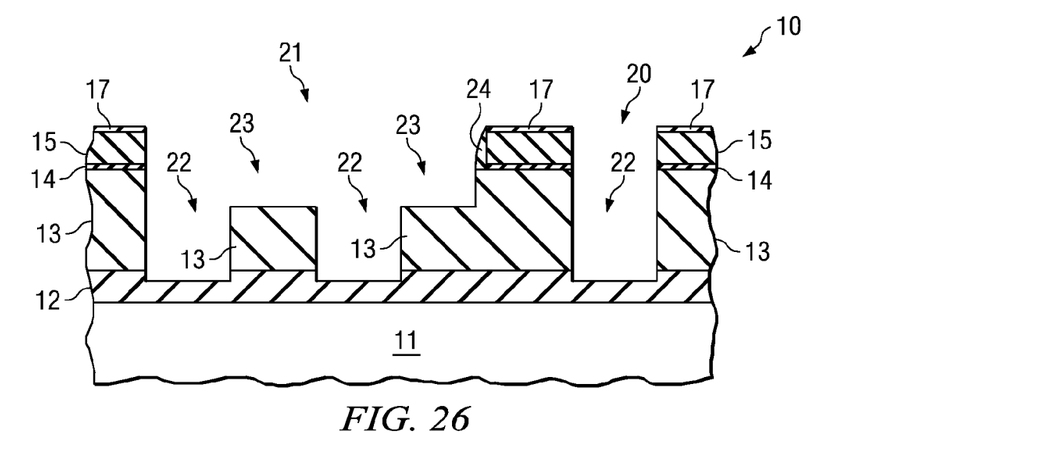
FIG. 26 is a further stage of formation according to a third embodiment of the invention.

In FIGS. 25 and 26 etching of the silicon layer 13 to the targeted shallow trench depth is shown for the first and second embodiments in FIG. 25 and for the third embodiment in FIG. 26. The shallow trench depth is selectively etched to the hard mask 16 and 17 and this completes the shape formation of the integrated deep and shallow trench structures. For compatibility with existing shallow trench planarization schemes it is desirable to have the initial nitride layer 15 still protected by a minimum leftover portion of the hard mask 16 or 17 from all etching processes at this stage.

Figure 27:
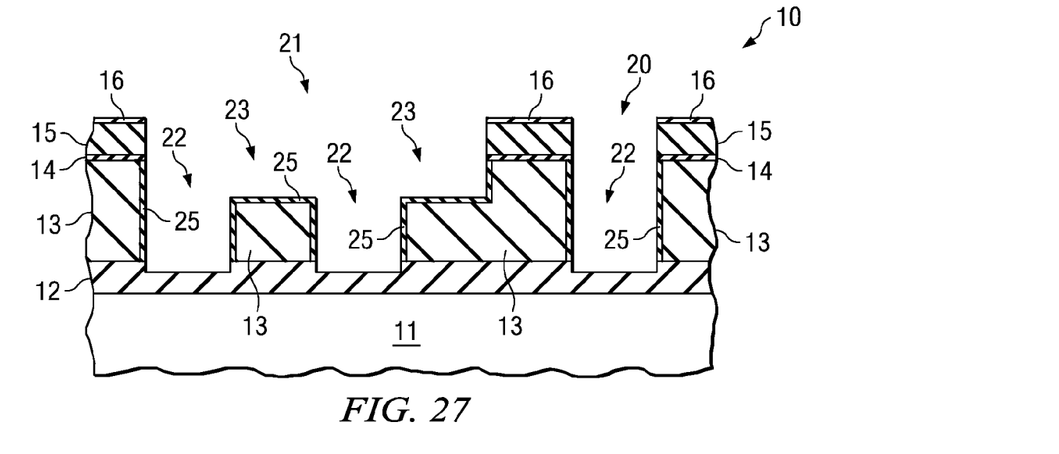
FIG. 27 is a further stage of formation according to first and second embodiments of the invention.
Figure 28:
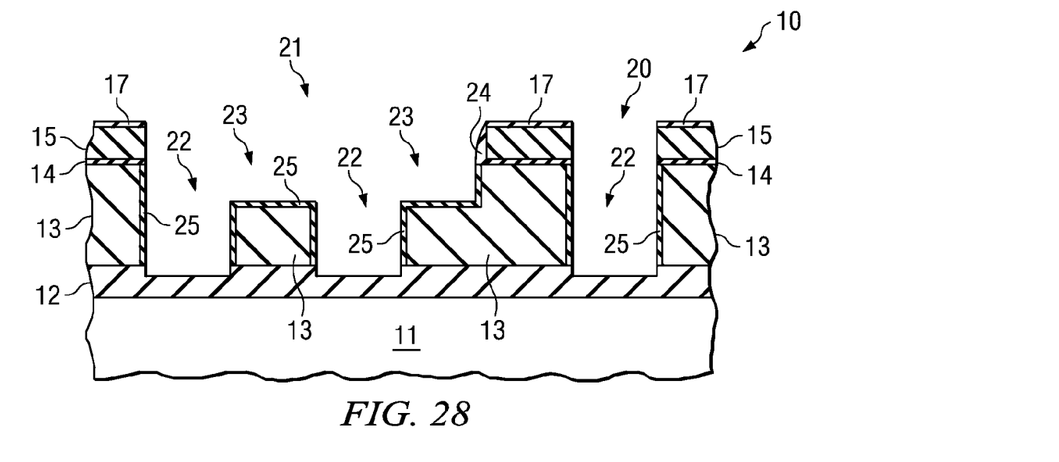
FIG. 28 is a further stage of formation according to a third embodiment of the invention.

A thin oxide liner 25 is then grown on the exposed surfaces of the silicon layer 13, as shown in FIG. 27 for the structure according to the first and second embodiments and in FIG. 28 for the structure according to the third embodiment.

Figure 29:
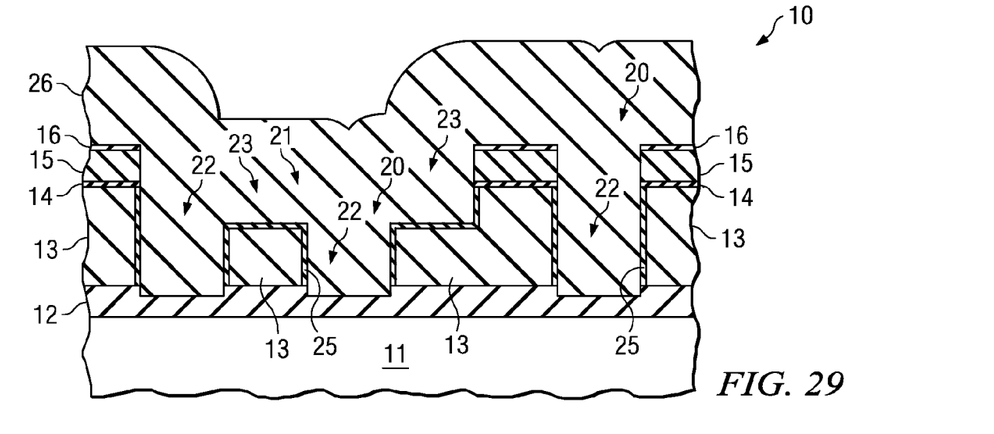
FIG. 29 is a filling stage according to first and second embodiments of the invention.
Figure 30:
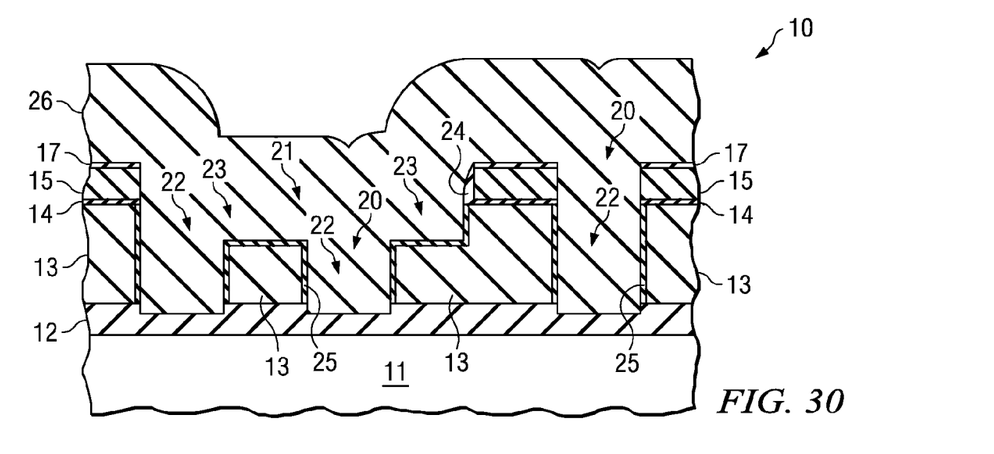
FIG. 30 is a filling stage according to a third embodiment of the invention.

After this step of liner oxidation, the integrated deep and shallow trenches are simultaneously filled with an oxide insulation filling material 26. This is shown in FIG. 29 for the first and second embodiments and in FIG. 30 for the third embodiment. Several deposition methods for filling the trench structures are known in the art that are suitable for this application, for example HDP or chemical vapor deposition (SACVD or APCVD). Also combined deposition and reflow procedures can be used to fill the structures. After deposition, the filling material can then be stabilized during a furnace operation.

Figure 31:
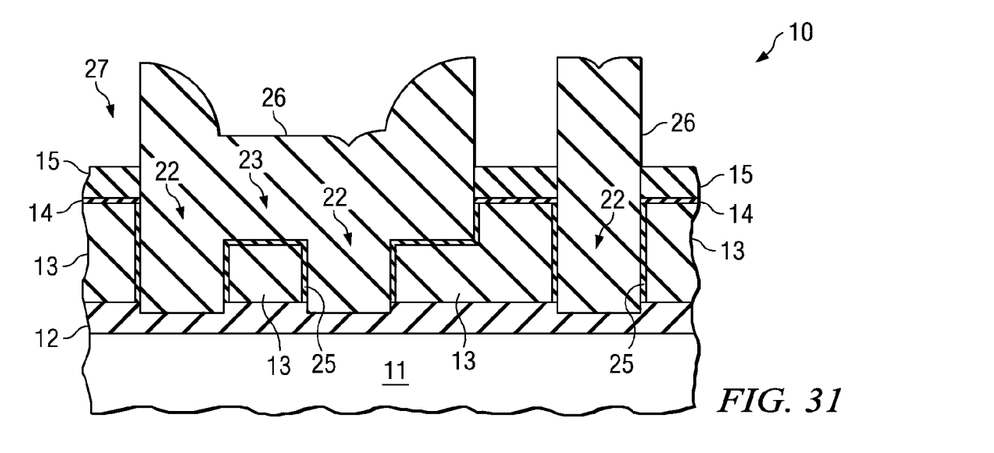
FIG. 31 is a schematic side view of a cross-section of a structure with filling material etched from all areas without trenches according to first and second embodiments of the invention.
Figure 32:
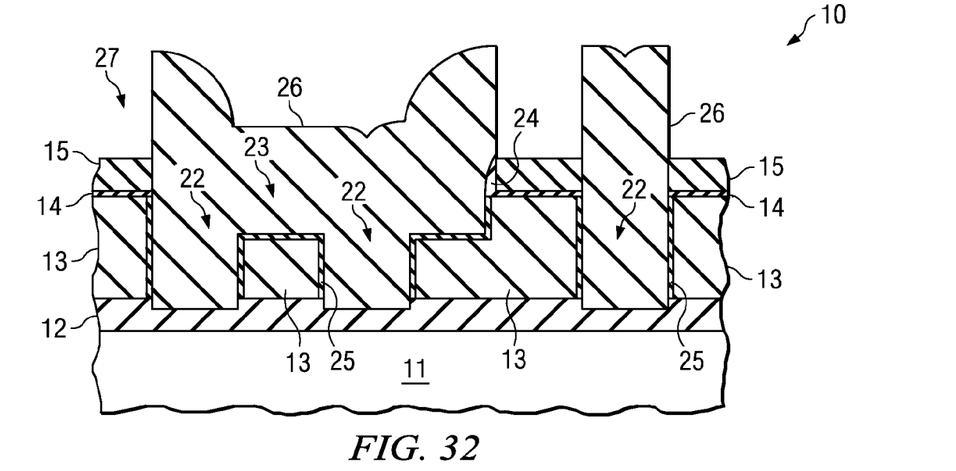
FIG. 32 is a schematic side view of a cross-section of a structure with filling material etched from all areas without trenches according to a third embodiment of the invention.
Figure 33:
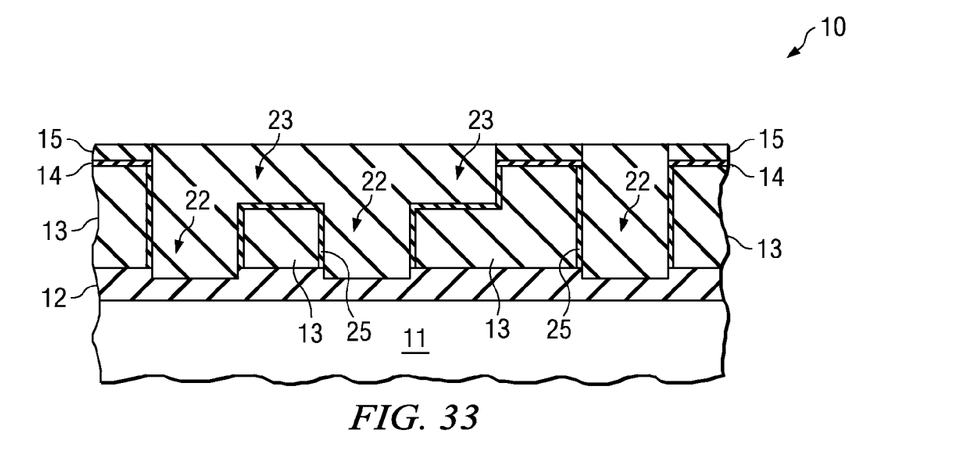
FIG. 33 is a schematic side view of a cross-section of a planarizing stage according to first and second embodiments of the invention.
Figure 34:
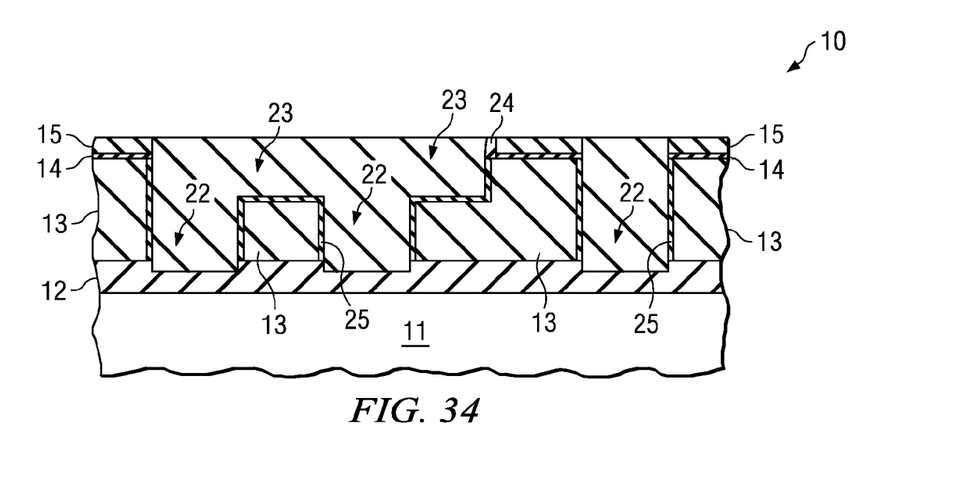
FIG. 34 is a schematic side view of a cross-section of a planarizing stage according to a third embodiment of the invention.

FIGS. 31 and 32 illustrate the structures of the first and second embodiments, and the third embodiment, respectively, after pattern and etch operations in the active silicon areas are used to relax planarization requirements. The filling material 26 has been etched from all areas without trenches to reduce the total amount of oxide to be removed during a subsequent planarization process. This etch operation stops on the surface of the nitride layer 15 and will automatically remove any hard mask film left over, except for the spacer 24 provided in the third embodiment. FIGS. 33 and 34 show the device with a flat surface after planarization has taken place.

Figure 35:
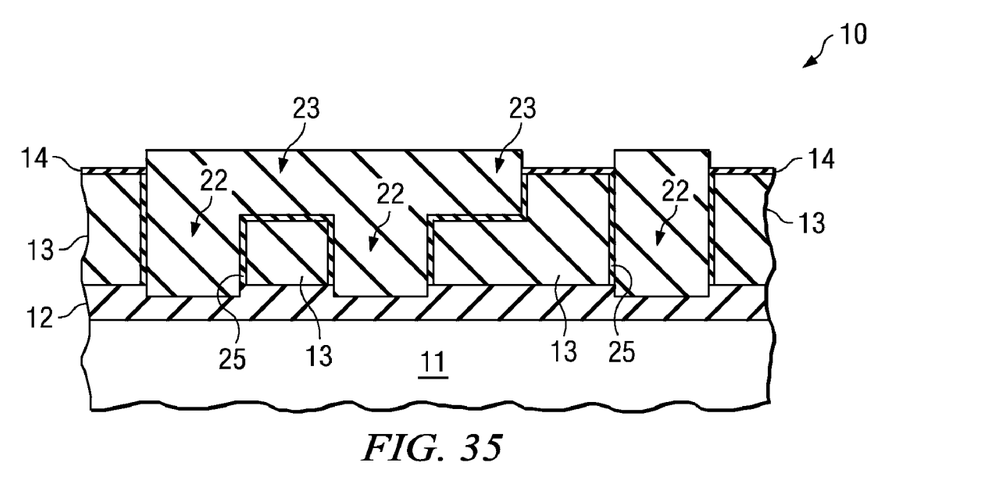
FIG. 35 is a schematic side view of a cross-section of a finished isolation structure according to first and second embodiments of the invention.
Figure 36:
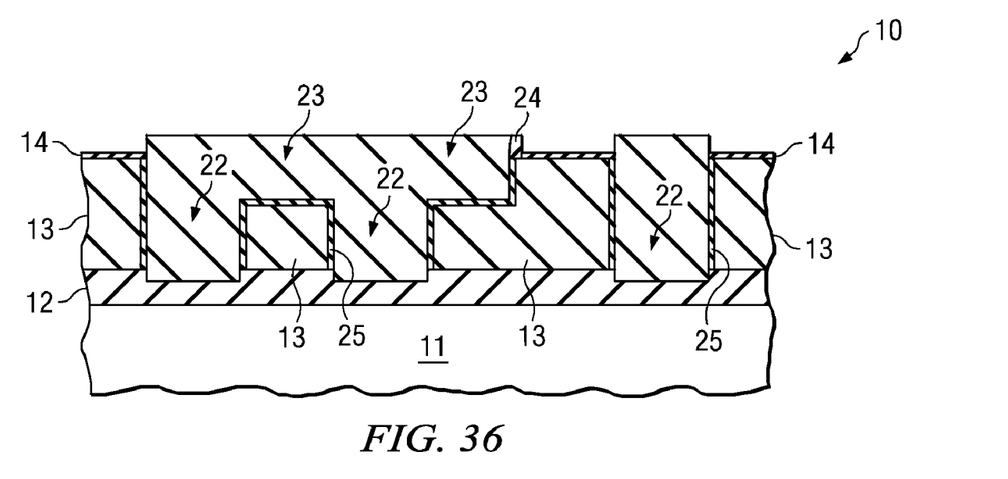
FIG. 36 is a schematic side view of a view of a cross-section of a finished isolation structure according to a third embodiment of the invention.

In FIGS. 35 and 36, which show the finished isolation structure of the first and second embodiments, and the third embodiment, respectively, the nitride layer 15 has been stripped from the surface of the device. It can be seen that formation of the spacer 24 in the third embodiment shown in FIG. 36 is independent of formation of the deep trenches 22. The spacer 24 will protect the interface between the oxide layer 14 and the silicon layer 13 from being attacked during subsequent cleaning steps with hydrofluoric acid. Thus a reduced complexity in the filling of the deep and shallow trenches and increased layout flexibility of the trenches on the device are provided.

Although the invention has been described hereinabove with reference to specific embodiments, it is not limited to these embodiments and no doubt alternatives will occur to the skilled person that lie within the scope of the invention as claimed.

What is claimed is:

1. A method of forming a semiconductor device including deep and shallow trench isolation structures, the method comprising:
    providing a substrate with a semiconductor layer;
    depositing a hard mask layer over the substrate semiconductor layer;
    etching the hard mask layer in a first etch using a first mask pattern to form deep trench openings with blind ends terminating at the substrate semiconductor layer;
    after the first etch, etching the hard mask layer in a second etch using a second mask pattern to form shallow trench openings with blind ends terminating in the hard mask layer, at least one shallow trench opening at least partially overlapping at least one deep trench opening;
    after the second etch, etching the substrate semiconductor layer and partially etching the hard mask layer in a third etch to deepen the deep trench openings further into the semiconductor layer, and to remove portions of the hard mask layer remaining in the shallow trench openings but leave partially etched portions of the hard mask layer remaining at locations away from the shallow trench openings and deep trench openings;
    after the third etch, etching the semiconductor layer in a fourth etch to deepen the shallow trenches and the deep trenches, with remaining partially etched portions of the hard mask acting to shield etching at locations away from the shallow trench openings and deep trench openings;
    following the fourth etch, forming a layer of insulation material to simultaneously fill the deep trenches and shallow trenches; and
    after filling the deep trenches and shallow trenches, planarizing to remove portions of the insulation material.

2. A method of forming a semiconductor device including deep and shallow trench isolation structures, the method comprising:
    providing a film stack on a substrate; the substrate including a silicon layer formed over a buried first oxide layer, and the film stack including a second oxide layer formed over the silicon layer, and a nitride layer formed over the second oxide layer;
    depositing a hard mask layer over the film stack;
    forming a first layer of photoresist with a first pattern over the hard mask layer; the first pattern defining openings of deep trenches;
    selectively etching the hard mask layer, nitride layer and second oxide layer through the patterned first layer of photoresist in a first etch to form the deep trench openings with blind ends terminating at or in the silicon layer;
    following the first etch, removing the patterned first layer of photoresist;
    following removing the patterned first layer of photoresist, forming a second layer of photoresist with a second pattern over the hard mask layer; the second pattern defining openings of shallow trenches, at least one shallow trench opening being defined to at least partially overlap at least one deep trench opening, and at least one deep trench opening not being overlapped by a shallow trench opening;
    selectively partially etching the hard mask layer through the patterned second layer of photoresist in a second etch to form the shallow trench openings with blind ends terminating in the hard mask layer;
    following the second etch, removing the patterned second layer of photoresist;
    following removing the patterned second layer of photoresist, simultaneously etching the silicon layer and partially etching the hard mask layer in a third etch to deepen the deep trenches so that their blind ends terminate at or in the buried first oxide layer, and to remove portions of the hard mask layer remaining in the shallow trench openings but leave partially etched portions of the hard mask layer remaining at locations away from the shallow trench openings and deep trench openings;
    following the third etch, selectively etching the second oxide layer and nitride layer from the shallow trench openings in a fourth etch to deepen the shallow trenches; the remaining partially etched portions of the hard mask acting to shield the second oxide layer and nitride layer from etching at locations away from the shallow trench openings and deep trench openings;
    following the fourth etch, simultaneously forming an oxide liner on exposed surfaces of the silicon layer in the deep trenches and shallow trenches; and
    simultaneously filling the oxide lined deep trenches and shallow trenches with oxide insulation filling material over the oxide liner.

3. The method of claim 2, further comprising planarizing with chemical-mechanical polishing after filling the deep trenches and shallow trenches with oxide insulation filling material.

4. The method of claim 3, wherein the second oxide layer comprises silicon oxide.

5. The method of claim 4, wherein the nitride layer comprises silicon nitride.

6. The method of claim 4, wherein the oxide insulation filling material comprises silicon oxide.

* * * * *